(12) United States Patent
Da Rocha et al.

(10) Patent No.: US 7,099,418 B2
(45) Date of Patent: Aug. 29, 2006

(54) RECEIVER FOR A MOBILE RADIO TERMINAL

(75) Inventors: Alexandre Da Rocha, Santa Clara, CA (US); Jean-Hugues Perrin, Argenteuil (FR); Paul Anandanarayanane, Villejuif (FR)

(73) Assignee: TCL Communications Technology Holdings Limited, Hong Kong (CN)

( * ) Notice: Subject to any disclaimer, the term of this patent is extended or adjusted under 35 U.S.C. 154(b) by 708 days.

(21) Appl. No.: 10/066,695

(22) Filed: Feb. 6, 2002

(65) Prior Publication Data

US 2002/0141521 A1 Oct. 3, 2002

(30) Foreign Application Priority Data

Feb. 22, 2001 (FR) .................................. 01 02391

(51) Int. Cl.
*H04B 1/10* (2006.01)
(52) U.S. Cl. .................. 375/350; 375/346; 455/296
(58) Field of Classification Search ............... 375/332, 375/319, 346, 130, 227, 344, 342, 350, 285, 375/343, 147, 235, 236, 345; 455/63, 69, 455/522, 437, 436, 442, 302, 150.1, 313, 455/179.1, 317, 182.1, 323, 324, 190.1, 234.2, 455/303, 296, 234.1; 370/318, 527, 529; 329/320
See application file for complete search history.

(56) References Cited

U.S. PATENT DOCUMENTS

| | | | | |
|---|---|---|---|---|
| 5,422,909 A * | 6/1995 | Love et al. | ................... | 375/147 |
| 5,946,607 A * | 8/1999 | Shiino et al. | ............. | 455/234.1 |
| 6,035,186 A * | 3/2000 | Moore et al. | ................ | 455/313 |
| 6,292,519 B1 * | 9/2001 | Popovic | ....................... | 375/346 |
| 6,351,651 B1 * | 2/2002 | Hamabe et al. | .............. | 455/522 |
| 6,353,641 B1 * | 3/2002 | Macq et al. | ................. | 375/319 |
| 6,356,748 B1 * | 3/2002 | Namgoong et al. | ......... | 455/324 |
| 6,370,205 B1 * | 4/2002 | Lindoff et al. | .............. | 375/319 |
| 6,373,909 B1 * | 4/2002 | Lindquist et al. | ........... | 375/346 |

(Continued)

FOREIGN PATENT DOCUMENTS

| EP | 0 719 013 A2 | 6/1996 |
|---|---|---|
| EP | 0 840 484 A2 | 5/1998 |
| EP | 0 895 385 A1 | 2/1999 |

(Continued)

OTHER PUBLICATIONS

Classical and modern receiver architectures Marabbasi, S. et al; Communications Magazine, IEEE vol. 38, Issue 11, Nov. 2000 pp. 132-139.*

(Continued)

*Primary Examiner*—Temesghen Ghebretinsae
(74) *Attorney, Agent, or Firm*—Sughrue Mion, PLLC

(57) ABSTRACT

A receiver of a mobile radio terminal in a telecommunication system includes a radio frequency signal generator, a frequency transposer, a high-pass filter which filters a static component and a dynamic component of interference induced by the operation of the radio frequency generator and the frequency transposer, and a digitizer. The high-pass filter has a predetermined cut-off frequency to eliminate the static component and a portion of the dynamic component before the signal enters the digitizer. A residual dynamic component is eliminated by a digital filter placed after the digitizer and a corrector.

13 Claims, 2 Drawing Sheets

U.S. PATENT DOCUMENTS

| | | | | |
|---|---|---|---|---|
| 6,427,068 B1 * | 7/2002 | Suominen | ............... | 455/302 |
| 6,507,627 B1 * | 1/2003 | Imura | ............... | 375/332 |
| 6,757,340 B1 * | 6/2004 | Jakobsson | ............... | 375/319 |
| 6,819,927 B1 * | 11/2004 | Sato | ............... | 455/437 |
| 6,834,197 B1 * | 12/2004 | Nakahara et al. | ............... | 455/522 |

FOREIGN PATENT DOCUMENTS

| | | |
|---|---|---|
| WO | WO 00/16490 | 3/2000 |

OTHER PUBLICATIONS

Design considerations for direct-conversion receivers; Razavi, B.; Circuits and Systems II: Analog and Digital Signal Processing, IEEE Transactions on vol. 44, Issue 6, Jun. 1997 pp. 428-435.*

Performance of a direct-conversion receiver with AC couplingWon Namgoong; Circuits and Systems II: Analog and Digital Signal Processing, IEEE Transactions on vol. 47, Issue 12, DDec. 2000 pp. 1556-1559.*

* cited by examiner

RECEIVER FOR A MOBILE RADIO TERMINAL

CROSS-REFERENCE TO RELATED APPLICATIONS

This application is based on French Patent Application No. 01 02 391 filed Feb. 22, 2001, the disclosure of which is hereby incorporated by reference thereto in its entirety, and the priority of which is hereby claimed under 35 U.S.C. §119.

BACKGROUND OF THE INVENTION

1. Field of the invention

The present invention relates to a receiver for a mobile radio terminal. The invention therefore relates more particularly to telecommunication systems.

2. Description of the prior art

Analog components in the radio frequency portion of a mobile radio terminal degrade the received signal supplied by the antenna.

This applies to the local oscillator in particular. The local oscillator produces a radio frequency signal that is fed to the frequency changer at the same time as the received signal to eliminate the carrier on which the received signal is transmitted on the propagation channel.

The frequency changer transposes the frequency of the received signal to a lower frequency.

The local oscillator and the frequency changer have inherent defects.

In particular, the local oscillator adds a direct current (DC) component to the received signal, whose frequency is therefore 0 Hz (Hertz). This DC component shifts the received signal upward or downward and its amplitude depends on the integrated circuit and on the isolation of the card.

Leaks from the local oscillator are radiated into the atmosphere after finding their way back to the antenna of the mobile radio terminal and reach the receiver of the mobile radio terminal after being reflected from external obstacles, thus creating an unwanted signal in addition to the received signal. This unwanted signal constitutes the dynamic component of the interference caused to the received signal by the behavior of the local oscillator and the frequency changer.

The frequency of the line that occurs due to the to-and-fro phenomenon described above cannot be controlled, in particular because of the time at which the reflection occurs and the speed at which the mobile radio terminal is moving. The frequency of the dynamic component is therefore related to the Doppler effect and depends on the speed of the mobile radio terminal.

The amplitude of the dynamic component cannot be controlled either.

The operation of the local oscillator and the frequency changer in the receiver of the mobile radio terminal therefore causes interference in the received signal. This interference is reflected in the appearance of a DC or static component at a frequency of 0 Hz and a dynamic component which can have any frequency and amplitude.

The static and dynamic component must be eliminated if the receiver of the mobile radio terminal is to operate correctly.

One prior art solution provides the receiver of the terminal with a filter to eliminate the static component and the dynamic component of the interference to the received signal induced by the local oscillator and the frequency changer.

The filter used is a high-pass filter. It is inserted between the frequency changer and the analog-to-digital converter in the receiver of the mobile radio terminal. This solution is therefore implemented in the analog domain.

However, using this kind of filter in the receiver has serious drawbacks, as shown in FIG. 1.

FIG. 1 shows the 0 Hz static component 1, the dynamic component 2, which has a frequency equal to fd, the spectral response 3 of the high-pass filter used, and the wanted signal 4, i.e. the received signal carrying the required information.

The filter is characterized by a slope and a cut-off frequency fc. The cut-off frequency fc is chosen to be sufficiently high to accommodate the maximum shift of the dynamic component 2, so that fc=fdmax. The frequency of the dynamic component 2, which depends partly on the speed at which the mobile radio terminal is moving, as explained above, cannot be controlled and changes as a function of the Doppler frequency. Accordingly, the high-pass filter used is characterized so that the receiver can accommodate a particular range of speeds and therefore high variations in the dynamic component, extending up as far as that range of speeds.

The filter is fixed and cannot be adapted to all situations.

Accordingly, in the FIG. 1 example, although the filter used is able to eliminate the static and dynamic components, it also strongly attenuates the whole of that portion of the modulated wanted signal denoted a in FIG. 1.

The unwanted attenuation of the portion a of the wanted signal seriously degrades the signal. This in turn degrades demodulation performance, which is reflected in a degraded bit error rate (BER), and the reduction in performance is directly related to the characteristics of the high-pass filter used, in particular its cut-off frequency.

A second prior art solution eliminates the static and dynamic components of the interference to the received signal by processing the signal following analog-to-digital conversion using a Least Mean Square (LMS) algorithm. The received signal is then processed entirely in the digital domain.

However, this type of algorithm is very complex to implement and necessitates a very high computing power, which can be unacceptable, and also means that the analog-to-digital converter cannot be optimized.

Accordingly, the object of the present invention is to eliminate both the static component and the dynamic component of the interference to the received signal induced by the operation of the local oscillator and the frequency changer in a manner that alleviates the drawbacks of the prior art, i.e. without degrading the demodulation performance of the mobile radio terminal and without unreasonable complexity.

To this end, the invention proposes to combine the two solutions previously described.

In accordance with the invention, the processing of the signal to eliminate the static and dynamic components of the interference is divided into two portions.

A first portion is effected in the analog domain and the second portion is effected in the digital domain.

Thus elimination of the static and dynamic components is shared between the analog domain and the digital domain.

SUMMARY OF THE INVENTION

The invention provides a receiver of a mobile radio terminal in a telecommunication system, the receiver including a radio frequency signal generator cooperating with a frequency transposer to transpose the frequency of a received signal to a lower frequency, a high-pass filter for filtering a static component and a dynamic component of interference to the received signal induced by the operation of the radio frequency generator and the frequency transposer, and a digitizer, in which device the high-pass filter has a predetermined cut-off frequency to eliminate the static component and a portion of the dynamic component before the signal enters the digitizer, a residual dynamic component being eliminated by a digital filter placed after the digitizer and a corrector.

The invention also provides a method of estimating a residual dynamic component of interference to a received signal in a receiver of a mobile radio terminal according to the invention, where the signal is transmitted in the form of frames divided into time slots, which method includes the following steps:

calculating the average value of the signal over a time slot;

determining the spacing expressed as a number of time slots between two consecutive calculations of the average value of the signal over a time slot;

determining the number of terms representing the average value of the signal over a time slot to be considered; and calculating the residual dynamic component of the interference to the received signal.

Other features and advantages of the invention will become more clearly apparent after reading the following description of one embodiment of the invention, which description is given with reference to the accompanying drawings.

DETAILED DESCRIPTION OF THE PREFERRED EMBODIMENT

Figure 1:
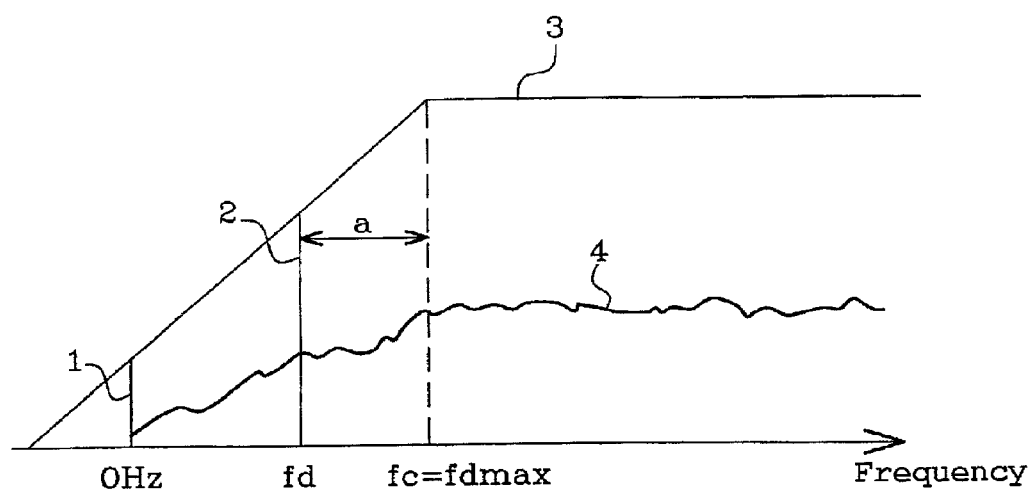
FIG. 1 is a diagram showing the drawbacks of the prior art and has already been commented on above.
Figure 2:
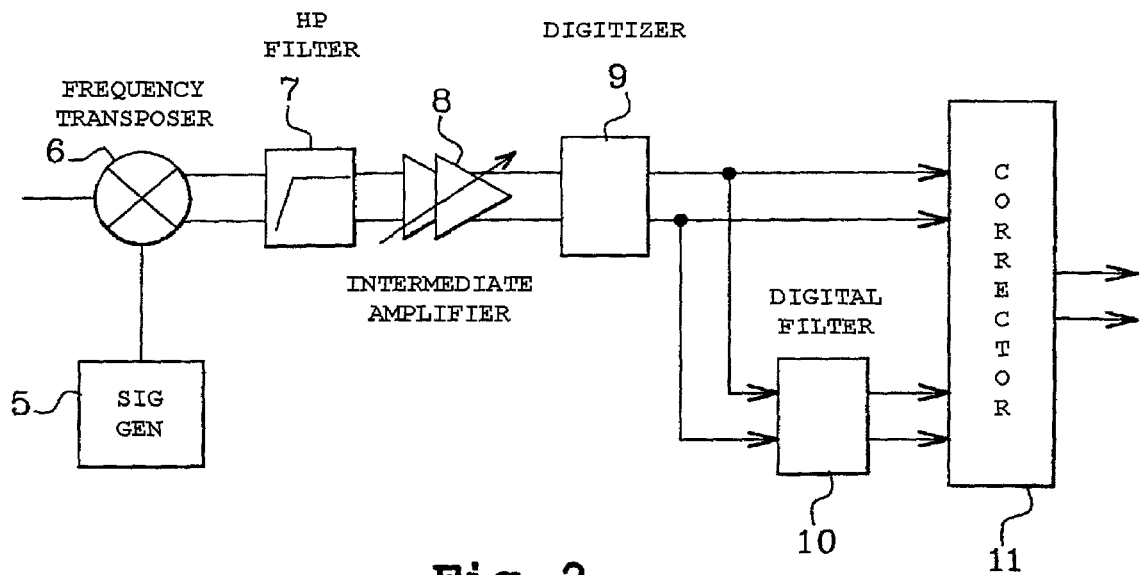
FIG. 2 is a diagram showing a receiver according to the present invention.

Referring to FIG. 2, a radio frequency signal generator 5 produces a radio frequency signal which is fed to a first input of a frequency transposer 6 at the same time as the received signal is supplied to a second input in order to transpose the frequency of the received signal to a lower frequency.

The radio frequency signal generator 5 typically consists of a local oscillator and the frequency transposer 6 typically consists of a frequency changer.

A high-pass filter 7 is placed at the output of the frequency changer on the input side of a digitizer 9 for digitizing the received signal. The digitizer 9 can take the form of an analog-to-digital converter.

An intermediate amplifier 8 can advantageously be provided between the filter 7 and the converter 9 to match the amplitude of the signal to the converter 9.

The outputs of the analog-to-digital converter 9 are connected, on the one hand, to a corrector 11 and, on the other hand, to a digital filter 10. The digital filter 10 is a high-pass filter and can be a finite impulse response filter.

The outputs of the digital filter 10 are also connected to the corrector 11.

The first filter 7 therefore applies high-pass filtering which eliminates the whole of the static component and a portion of the dynamic component of the interference to the received signal induced by the operation of the radio frequency signal generator 5 and the frequency transposer 6.

Thus the cut-off frequency fc of the filter 7 is predetermined, as follows:

$$fc = fd\max.(1-x)$$

In the above equation, fdmax is the maximum Doppler frequency that the receiver can accommodate. In other words, fdmax corresponds to the highest frequency of the dynamic component of the interference to the received signal that the receiver can accommodate.

In the above equation defining the cut-off frequency fc of the first filter 7, x is expressed as a percentage.

The value of x, and therefore the cut-off frequency fc, are predetermined to reduce the number of bits to be processed by the digitizer 9. The cut-off frequency determined in this way then eliminates a first portion of the components of the interference to the received signal. This first portion eliminated includes the static component and a portion of the dynamic component. Thus, as it were, the dynamic component is trimmed to the maximum so that it is already of reduced magnitude when the signal enters the converter.

The remaining portion of the dynamic component of the interference to the received signal is entirely eliminated by, on the one hand, the digital filter 10 that follows the digitizer 9 and, on the other hand, the corrector 11.

The following explanation considers a Wideband Code Division Multiple Access (WCDMA) telecommunication system.

In a WCDMA telecommunication system the signals transmitted conform to a particular format. Thus the signals are transmitted in the form of frames and each frame is divided into 15 time slots. In a WCDMA system each time slot contains 2 560 values.

The receiver according to the present invention is nevertheless suitable for any type of telecommunication system. The following explanation in the context of a WCDMA system is merely given by way of example and must not be interpreted as limiting the scope of the invention.

The signal $S_n$ from the analog-to-digital converter 9 contains the wanted signal $S_n^{wanted}$, the interference $S_n^{intra-interf}$ from other users inside the current cell, interference $S_n^{inter-interf}$ from other adjacent cells, the additive Gaussian white noise $n_n$, and, finally, the residual dynamic component $DC_k$ of the interference to the received signal induced by the radio frequency signal generator 5 and by the frequency transposer 6. Accordingly:

$$S_n = S_n^{wanted} + S_n^{intra-interf} + S_n^{inter-interf} + n_n + DC_k$$

It therefore remains to estimate the residual dynamic component $DC_k$ that has not been eliminated by the high-pass first filter 7 used ahead of the converter 9.

To this end, the signal $S_n$ is processed in the digital filter 10 that follows the converter 9. The function of the digital filter 10 is therefore to calculate the residual dynamic component $DC_k$ and then to supply the corrector 11 with the signal representative of this residual component of the interference to the received signal.

The corrector 11 then extracts this residual signal from the signal $S_n$ coming from the analog-to-digital converter 9.

The processing effected in the digital filter 10 consists of averaging the signal $S_n$ over a particular number of frames and therefore over a particular number of time slots.

Although the following explanation relates to a WCDMA system, this processing can be effected in any type of telecommunication system.

In a first step, the average value $m_k$ of the received signal is calculated over a complete time slot or over a portion of a time slot. The calculation is effected in the following manner for the $k^{th}$ time slot:

$$m_k = \sum_{n=1}^{2560(1-p)} S_n = \sum_{n=1}^{2560(1-p)} S_n^{wanted} + \sum_{n=1}^{2560(1-p)} S_n^{intra-interf} + \sum_{n=1}^{2560(1-p)} S_n^{inter-interf} + \sum_{n=1}^{2560(1-p)} n_n + \sum_{n=1}^{2560(1-p)} DC_k$$

The variable p determines the time slot portion over which the calculation is effected. For example, if p is made equal to 0.2, $m_k$ is calculated over 80% of the values of the time slot.

In a WCDMA system all the signals are centered on zero. The average values of the signals $S_n^{wanted}$, $S_n^{intra-interf}$, $S_n^{inter-interf}$ and $n_n$ are therefore zero, and in this case:

$$m_k = 2\,560.(1-p).DC_k$$

The residual dynamic component $DC_k$ hardly varies at all over the kth time slot concerned.

A second step consists of determining the spacing P, expressed as a number of time slots, to be taken into account between two consecutive calculations of the average value $m_k$ of the signal over a time slot or a time slot portion.

It is not necessary to average the signal over consecutive time slots. The detailed calculation performed in the preceding step to obtain the average value $m_k$ of the signal either over a complete time slot or over a time slot portion can therefore be effected every time slot, every two time slots, every three time slots, etc.

The variable P determines this spacing and P takes different values depending on the required configuration. If only one estimate $m_k$ is required per frame, P is made equal to 14, if two estimates $m_k$ are required per frame, P is made equal to 28, and so on. Also, to obtain a plurality of estimates $m_k$ per frame, it is sufficient to set P<14. This condition P<14 applies to the following explanations.

A third step determines the number N of terms $m_k$ representing the average value of the signal over a complete time slot or a time slot portion, which is used to estimate the residual dynamic component of the interference to the received signal.

Using the parameter N, the algorithm estimates the residual dynamic component on the basis of a complete frame or a frame portion. Thus only N consecutive average values $m_k$ spaced by P time slots are taken into account in estimating the residual dynamic component.

Finally, a final step calculates the residual dynamic component estimated over the current frame T.

This step effects the following calculation:

$$DC_T^{estimated} = \frac{1}{N \cdot 2560 \cdot (1-p)} \cdot \sum_{k=0}^{N-1} m_k$$

The estimate $DC_T^{estimated}$ of the residual dynamic component corresponds to the instantaneous estimate for the current frame T.

To minimize the impact of an instantaneous estimate error, the history of estimates of the residual dynamic component is taken into account. A forget factor $\alpha$ is used for this purpose and the value of the residual dynamic component is averaged in the following manner over the current frame T:

$$DC_T^{averaged} = (1-\alpha).DC_T^{estimated} + \alpha.DC_{T-1}^{averaged};$$
$$0 \leq \alpha < 1$$

The result is therefore weighted to a greater or lesser degree, depending on the value of $\alpha$, as a function of the value of the residual dynamic component $DC_{T-1}^{averaged}$ calculated over the preceding frame T−1.

To finish, the digital filter 10 supplies to the corrector 11 the signal $DC_T^{averaged}$ representative of the residual dynamic component of the interference to the received signal.

Figure 3:
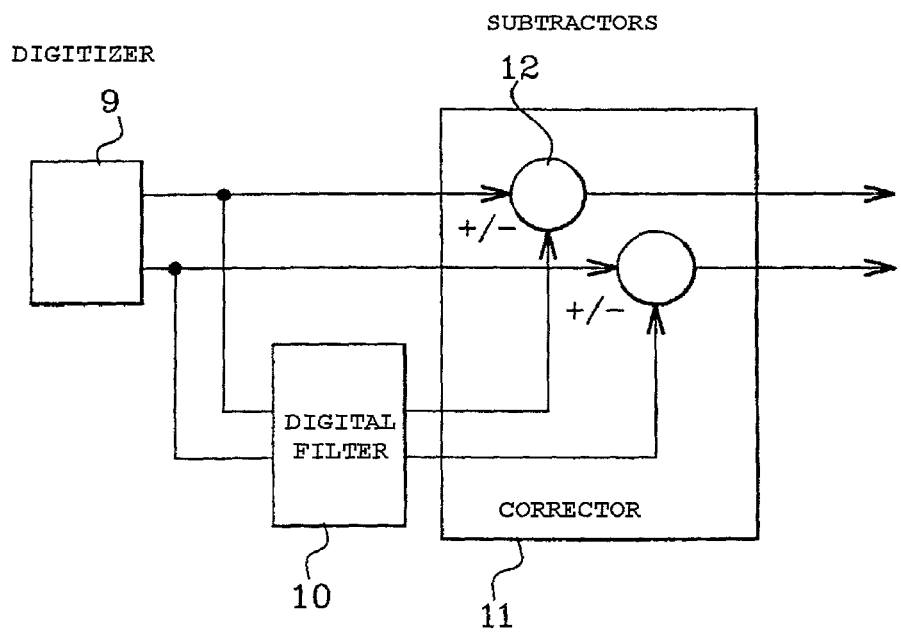
FIG. 3 is a more detailed diagram corresponding to a portion of the FIG. 2 diagram.

The corrector 11 then extracts this component from the signal coming from the digitizer 9 by means of the subtractor 12 (see FIG. 3).

The output signal of the corrector 11 is therefore equal to the difference between the signal coming from the converter 9 and the signal calculated by the digital filter 10 representing the residual dynamic component of the interference to the received signal.

The algorithm used is therefore much less complex than an LMS algorithm and also provides great flexibility for calculating the residual dynamic component.

In addition, the invention optimizes the range of use of the analog-to-digital converter since some of the components of the interference to the received signal are eliminated by the first filter before digitization. This reduces power consumption.

The invention claimed is:

1. Receiver of a mobile radio terminal in a telecommunication system, said receiver including a radio frequency signal generator cooperating with a frequency transposer to transpose the frequency of a received signal to a lower frequency, a high-pass filter for filtering a static component and a dynamic component of interference to said received signal induced by the operation of said radio frequency generator and said frequency transposer, and a digitizer, in which device said high-pass filter has a predetermined cut-off frequency to eliminate said static component and a portion of said dynamic component before said signal enters said digitizer, a residual dynamic component of said interference being eliminated by a digital filter placed after said digitizer and a corrector, said corrector comprising a subtractor for subtracting said residual dynamic component from the signal coming from said digitizer.

2. The device claimed in claim 1 wherein said digital filter calculates said residual dynamic component and supplies said corrector with a signal representative of said residual dynamic component.

3. The device claimed in claim 1 wherein said digital filter is a high-pass filter.

4. The device claimed in claim 1 wherein said subtractor calculates the difference between said signal coming from said digitizer and a signal representative of said residual dynamic component coming from said digital filter.

5. A method of estimating a residual dynamic component of interference to a received signal in a receiver of a mobile radio terminal, said receiver including a radio frequency signal generator cooperating with a frequency transposer to transpose the frequency of a received signal to a lower frequency, a high-pass filter for filtering a static component and a dynamic component of interference to said received signal induced by the operation of said radio frequency generator and said frequency transposer, and a digitizer, in which device said high-pass filter has a predetermined cut-off frequency to eliminate said static component and a portion of said dynamic component before said signal enters said digitizer, a residual dynamic component of said interference being eliminated by a digital filter placed after said digitizer and which estimates said residual dynamic component, and a corrector which subtracts said estimated residual dynamic component from an output of said digitizer, where the signal is transmitted in the form of frames divided into time slots, which method includes the following steps:
 calculating an average value of said signal over a time contained within a time slot;
 determining a spacing expressed as a number of time slots between two consecutive calculations of said average value;
 determining the number of calculated average values to be considered in calculating said residual dynamic component;
 calculating said residual dynamic component of said interference to said received signal; and
 supplying said calculated residual dynamic component to said corrector.

6. The method claimed in claim 5 wherein said average value of said signal is calculated over a time slot portion less than an entire time slot.

7. The method claimed in claim 5 wherein the final step first calculates an instantaneous estimate of said residual dynamic component and then averages said estimate, applying a forget factor to take into account a history of estimates of said residual dynamic component.

8. The method claimed in claim 5 wherein said steps are implemented in said digital filter placed after said digitizer.

9. A method of removing interference from a received signal in a receiver of a mobile radio terminal, said method including the steps of removing a portion of a dynamic component of interference from said signal to form a partially corrected signal, estimating a residual dynamic component of said interference and subtracting said estimated residual dynamic component from said partially corrected signal, wherein said estimating step includes the following steps:
 calculating an average value of said signal over a time contained within a time slot;
 determining a spacing expressed as a number of time slots between two consecutive calculations of said average value;
 determining the number of calculated average values to be considered in calculating said residual dynamic component; and
 calculating said residual dynamic component of said interference to said received signal.

10. The method claimed in claim 9 wherein said average value of said signal is calculated over a time slot portion less than an entire time slot.

11. The method claimed in claim 9 wherein the final step first calculates an instantaneous estimate of said residual dynamic component and then averages said estimate, applying a forget factor to take into account a history of estimates of said residual dynamic component.

12. The method claimed in claim 9, wherein said receiver includes a radio frequency signal generator cooperating with a frequency transposer to transpose the frequency of a received signal to a lower frequency, a high-pass filter for filtering a static component and a dynamic component of interference to said received signal induced by the operation of said radio frequency generator and said frequency transposer, and a digitizer, in which device said high-pass filter has a predetermined cut-off frequency to eliminate said static component and a portion of said dynamic component before said signal enters said digitizer, said residual dynamic component of said interference being eliminated by a digital filter placed after said digitizer and a corrector, where the signal is transmitted in the form of frames divided into time slots.

13. The method claimed in claim 12 wherein said steps are implemented in said digital filter.

* * * * *